United States Patent [19]
Hara et al.

[11] Patent Number: 5,915,180
[45] Date of Patent: *Jun. 22, 1999

[54] PROCESS FOR PRODUCING A SEMICONDUCTOR DEVICE HAVING A SINGLE THERMAL OXIDIZING STEP

[75] Inventors: Kazukuni Hara, Oobu; Norihito Tokura, Okazaki; Takeshi Miyajima, Kariya; Hiroo Fuma, Ichinomiya; Hiroyuki Kano, Nishikamo-gun, all of Japan

[73] Assignee: Denso Corporation, Kariya, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/418,147

[22] Filed: Apr. 5, 1995

[30] Foreign Application Priority Data

Apr. 6, 1994 [JP] Japan .................................... 6-068790

[51] Int. Cl.$^6$ ................................................. H01L 21/335
[52] U.S. Cl. .......................... 438/270; 438/268; 438/197; 438/198; 438/931; 257/77; 257/328; 257/330; 257/339
[58] Field of Search .............................. 257/77, 627, 628, 257/330, 333, 339, 328; 437/100; 438/270, 268, 197, 198, 931

[56] References Cited

U.S. PATENT DOCUMENTS

| | | | |
|---|---|---|---|
| 4,914,058 | 4/1990 | Blanchard | 438/270 |
| 4,992,390 | 2/1991 | Hsueh-Rong | 438/270 |
| 5,072,266 | 12/1991 | Bulucea et al. | 257/330 |
| 5,170,231 | 12/1992 | Fujii et al. | 257/368 |
| 5,233,215 | 8/1993 | Baliga | 257/490 |
| 5,323,040 | 6/1994 | Baliga | 257/332 |
| 5,389,799 | 2/1995 | Uemoto | 257/77 |
| 5,399,515 | 3/1995 | Davis et al. | 438/270 |
| 5,506,421 | 4/1996 | Palmour | 257/77 |

FOREIGN PATENT DOCUMENTS

| | | |
|---|---|---|
| 59-008374 | 1/1984 | Japan . |
| 2102579 | 4/1990 | Japan . |
| 4-239778 | 8/1992 | Japan . |
| 0548145 | 2/1993 | Japan ....................................... 257/77 |
| 5102497 | 4/1993 | Japan . |
| WO 94 13017 | 6/1994 | WIPO . |

OTHER PUBLICATIONS

Denkiteushin Gakkaishi, vol. 39, No. 3, pp. 851–857, Dec. 1986 by Matsunami et al.

(List continued on next page.)

Primary Examiner—Peter Toby Brown
Assistant Examiner—Edwin Oh
Attorney, Agent, or Firm—Pillsbury Madison & Sutro LLP

[57] ABSTRACT

A semiconductor device, which has an oxide layer with the thickness thereof being varied from portion to portion of the inner surface of a trench and can be easily produced, and a process of producing the same. An n$^+$ type single crystal SiC substrate is formed of SiC of hexagonal system having a carbon face with a (0001) face orientation as a surface, and an n type epitaxial layer and a p type epitaxial layer are successively laminated onto the substrate. An n$^+$ source region is provided within the p type epitaxial layer, and the trench extends through the source region and the epitaxial layer into the semiconductor substrate. The side face of the trench is almost perpendicular to the surface of the epitaxial layer with the bottom face of the trench having a plane parallel to the surface of the epitaxial layer. The thickness of a gate oxide layer, formed by thermal oxidation, on the bottom face of the trench is larger than the thickness of the gate oxide layer on the side face of the trench. A gate electrode layer is provided on the surface of the oxide layer, formed by thermal oxidation, within the trench, a source electrode layer is provided on the epitaxial layer and the source region, and a drain electrode layer is provided on the back surface of the semiconductor substrate.

13 Claims, 11 Drawing Sheets

OTHER PUBLICATIONS

NASA Tech Briefs, Feb. 1995, p. 30 "Power MOSFETs formed in Silicon Carbide", by Palmour.

Patent Abstracts of Japan, vol. 013, No. 483 (E–839), Nov. 2, 1989 Re: JP 01–192174 A.

Patent Abstracts of Japan, vol. 012, No. 330 (E–655), Sep. 7, 1988 re JP 63 094687 A, Apr. 25, 1988.

Patent Abstracts of Japan, vol., 018, No. 161 (E–1526), Mar. 17, 1994 re: JP 05 335582 A, Dec. 17, 1993.

Palmour J W et al,"6–H Silicon Carbide Power Devices for Aerospace Applications" Aerospace Power, Conversion Technology, Electrochemical Conversion, Atlanta, Aug. 8–13, 1993, vol. 1, Aug. 8, 1993, Institute of Electrical Engineers, pp. 1.249–1.254.

Proceedings of the 28th Intersociety Energy Conversion Engineering Conference; American Chemical Society; Aug. 8, 1997; pp. 1.249–1.254.

Akira Suzuki; Thermal Oxidation of SiC and Electrical Properties of AL–SiO2–SiC Mos Structure; Japanese Journal of Applied Physics; Jan. 23, 1982; pp. 579–586.

Muelhoff, L et al., "Comparative electron spectroscopic studies of surface segregation on SiC(0001) and SiC(0001)," J. Appl. Phys. 60(8), Oct. 15, 1986 (1986 American Institute of Physics), pp. 2842–2853.

PROCESS FOR PRODUCING A SEMICONDUCTOR DEVICE HAVING A SINGLE THERMAL OXIDIZING STEP

BACKGROUND OF THE INVENTION

1. Field of the Invention

The present invention relates to a semiconductor device, for example, an insulated gate type field effect transistor, especially a high-power vertical MOSFET.

2. Description of the Related Art

In recent years, vertical power MOSFETs prepared using a silicon single crystal have been used widely as a power transistor. In order to reduce the occurrence of loss in the power transistor, it is necessary to reduce the ON resistance. For this purpose. a trench gate type power MOSFET shown in FIG. 7 has been proposed as a device structure capable of effectively reducing the ON resistance (for example, Japanese Unexamined Patent Publication (Kokai) No. 59-8374). In the trench gate type power MOSFET, an n type epitaxial layer 21 is provided on an n type semiconductor substrate 20, a p type diffused layer 22 is provided on the n type epitaxial layer 21 and an n type diffused layer 23 is provided in the p type diffused layer 22 in its predetermined region. Further, a trench 24 is provided which extends through the n type diffused layer 23 and the p type diffused layer 22 into the n type epitaxial layer 21. The trench 24 in its interior is filled with a polysilicon layer 26 through a gate oxide layer 25. An oxide layer 27 is provided on the upper surface of the polysilicon layer 26, and an aluminum layer 28 is formed on the n type diffused layer 23 including the surface of the oxide layer 27.

In this case, with respect to the trench gate portion, after the formation of a trench 24, the surface of the trench 24 is thermally oxidized to form a gate oxide layer 25 in the trench on its side faces and bottom face, and, thereafter, a gate electrode (a polysilicon layer 26) is formed to complete the fundamental structure of the trench gate. In the above step of oxidizing the surface of the trench 24, the thickness of the oxide layer in the portion located on the side face of the trench 24 should be thin (for example, 50 nm) in order to set the gate threshold voltage at a low value. In the case of silicon wherein the dependency of the oxidation rate upon the direction of the plane is small, the oxide layer, located on the bottom face of the trench 24, formed simultaneously with the formation of the oxide layer located on the side face of the trench 24 is as thin as the oxide layer located on the side face of the trench 24. For this reason, the thin oxide layer located on the bottom face of the trench 24 sandwiched between a low-potential gate electrode and a high-potential drain layer is likely to cause breakdown, making it difficult to prepare a trench gate type power MOSFET having a high resistance to voltage.

A known method for solving this problem is disclosed in, for example, Japanese Unexamined Patent Publication (Kokai) No. 2-102579. This method involves repeating, a plurality of times, the step of forming an oxide layer and the step of forming an oxidation-resistant mask on the side face of the trench so that the thickness of the oxide layer is small in the portion located on the side face of the trench with the thickness thereof in its portion located on the bottom face being large, thereby preparing a trench gate type power MOSFET having a combination of low gate threshold voltage with high resistance to voltage. The steps of this method will now be described in detail with reference to FIGS. 8 to 16.

At the outset, as shown in FIG. 8, an n type epitaxial layer 31 is formed on a low-resistance n⁺ type semiconductor substrate 30, and a p type diffused layer 32 is formed on the n type epitaxial layer 31. Thereafter, a first oxide layer 33 is formed by thermal oxidation on the p type diffused layer 32. Then, as shown in FIG. 9, the first oxide layer 33 is patterned by photolithography to remove the first oxide layer to a given width. Thereafter, a trench 34 extending through the p type diffused layer 32 into the n type epitaxial layer 31 is formed by reactive ion etching (RIE) using the first oxide layer 33 as a mask.

Subsequently, as shown in FIG. 10, the first oxide layer 33 is removed, and a second oxide layer 35 is formed by thermal oxidation on the upper surface of the p type diffused layer 32 and the surface of the trench 34. Further, a silicon nitride layer 36 and a third oxide layer 37 are successively formed on the second oxide layer 35.

Thereafter, as shown in FIG. 11, the third oxide layer 37, the silicon nitride layer 36, and the second oxide layer 35 are successively subjected to anisotropic etching by RIE to leave as a side wall the second oxide layer 35, the silicon nitride layer 36, and the third oxide layer 37 on the side wall of the trench 34 with the other portions thereof being entirely removed.

Then, as shown in FIG. 12, the silicon nitride layer 36 in its portion located on a corner portion 34a at the bottom of the trench 34 is etched away with hot phosphoric acid.

Subsequently, as shown in FIG. 13, the third oxide layer 37 is removed with hydrofluoric acid, and a fourth oxide layer 38 is formed by thermal oxidation on the surface of the trench 34, except for the portion where the silicon nitride layer 36 is disposed, and on the p type diffused layer 32.

Thereafter, as shown in FIG. 14, the silicon nitride layer 36 is removed with hot phosphoric acid, and a gate oxide layer 39 is then formed in that portion by thermal oxidation.

Subsequently, as shown in FIG. 15, the interior of the trench 34 is successively filled with a first polysilicon layer 40 and a second polysilicon layer 41.

Thereafter, as shown in FIG. 16, the fourth oxide layer 38 located on the p type diffused layer 32 is etched away, and a low-resistance n⁺ type diffused layer 42 is formed in the p type diffused layer 32. Thereafter, a fifth oxide layer 43 is formed by thermal oxidation on the first and second polysilicon layers 40, 41, and an aluminum layer 44 is formed on the fifth oxide layer 43 and the n⁺ type diffused layer 42, thereby completing a vertical MOSFET.

Thus, a vertical MOSFET is provided which comprises an n⁺ type semiconductor substrate 30, a trench 34 extending through a p type diffused layer 32 and an n⁺ type diffused layer 42 successively laminated on the semiconductor substrate, a thin gate oxide layer 39 provided on the side face of the p type diffused layer 32 in the trench 34, a thick fourth oxide layer 38 on the other portions including a corner portion 34a in the trench 34, polysilicon layers 40, 41 buried in the trench 34, and an aluminum layer 44 deposition-formed as the outermost layer.

The above conventional method enables the insulation layer on the side face of trench 34, except for the corner portion of the trench 34 at its bottom, to be formed thin with the insulation layer on the bottom of the trench 34 including the corner portion of the trench 34 being formed thick. By virtue of this, the threshold voltage can be lowered, and, at the same time, high resistance to voltage can be attained, preventing deterioration in the semiconductor device derived from poor resistance to voltage.

In the preparation of a trench gate type power MOSFET having low threshold voltage and high resistance to voltage by the above conventional method using silicon as a semiconductor material, however, a complicated production process involving the step of repeating in a plurality of times oxidation and formation of an oxidation-resistant layer should be provided in order to form, within the trench 34, an insulation layer having a small thickness in its portion formed on the side face of the trench 34 with the thickness of the insulation layer in its portion formed on the bottom of the trench 34 being large. This raises problems of high production cost and low production yield.

SUMMARY OF THE INVENTION

An object of the present invention is to provide a semiconductor device, which has an oxide layer with the thickness thereof being varied from portion to portion of the inner surface of a trench and can be easily produced, and a process of producing the same.

In order to attain the above object, according to the first aspect of the present invention, there is provided a semiconductor device comprising: a single crystal silicon carbide of hexagonal system having a carbon face with a (0001) face orientation as a surface; a trench provided in the single crystal silicon carbide and having a side face and a bottom; and an oxide layer, formed by thermal oxidation, provided on the side face and the bottom face of the trench, the thickness of the oxide layer on the bottom face of the trench being larger than the thickness of the oxide layer on the side face of the trench.

According to the second aspect of the present invention, there is provided a semiconductor device comprising: a semiconductor substrate formed of a single crystal silicon carbide of a hexagonal system, comprising two layers of a first conductive type low-resistance layer and a first conductive type high-resistance layer formed on the low-resistance layer, the high-resistance layer having a carbon face with a (0001) face orientation; a second conductive type semiconductor layer, provided on the surface of the semiconductor substrate, formed of a single crystal silicon carbide of a hexagonal system having a carbon face with a (0001) face orientation as a surface; a first conductive type semiconductor region provided in a predetermined region of the semiconductor layer; a trench extending through the semiconductor region and the semiconductor layer into the semiconductor substrate and having a side face and a bottom face; a gate oxide layer as a gate insulating layer, formed by thermal oxidation, provided on the side face and the bottom face of the trench, the thickness of the gate oxide layer on the bottom face of the trench being larger than the thickness of the gate oxide layer on the side face of the trench; a gate electrode layer provided on the surface of the gate oxide layer, formed by thermal oxidation, within the trench; a first electrode layer provide on the surface of the semiconductor layer and the surface of the semiconductor region; and a second electrode layer provided on the back surface of the semiconductor substrate.

According to the third aspect of the present invention, there is provided a process for producing a semiconductor device, comprising: a first step of laminating a first conductive type high-resistance layer formed of a single crystal silicon carbide of a hexagonal system on a first conductive type low-resistance layer formed of a single crystal silicon carbide of a hexagonal system to form a semiconductor substrate wherein the high-resistance layer has a carbon face with a (0001) face orientation as a surface; a second step of forming, on the surface of the semiconductor substrate, a second conductive type semiconductor layer of a single crystal silicon carbide of a hexagonal system having a carbon face with a (0001) face orientation as a surface and forming a first conductive type semiconductor region in a predetermined region of the semiconductor layer; a third step of forming a trench extending through the semiconductor region and the semiconductor layer into the semiconductor substrate, the trench having a side face and a bottom face; a fourth step of thermally oxidizing the inner wall of the trench to form a gate oxide layer as a gate insulating layer, the thickness of the gate oxide layer on the bottom face of the trench being larger than the thickness of the gate oxide layer on the side face of the trench; and a fifth step of forming a gate electrode layer on the surface of the gate oxide layer, formed by thermal oxidation, within the trench, forming a first electrode layer on the surface of the semiconductor layer and on the surface of the semiconductor region, and forming a second electrode layer on the back surface of the semiconductor substrate.

According to the first aspect of the present invention, the (0001) carbon face, having a high oxidation rate, of a single crystal silicon carbide of hexagonal system constitutes the bottom face of a trench, while the plane, havina a low oxidation rate, perpendicular to the (0001) carbon face constitutes the side face of the trench. By virtue of this constitution, an oxide layer with the thickness thereof in its portion located on the side face of the trench being different from that in its portion located on the bottom face of the trench can be formed by onestage thermal oxidation.

According to the second aspect of the present invention, the second conductive type semiconductor layer in its surface located at the side face of the trench serves as a channel, permitting a current to flow across a source and a drain. In this case, the gate oxide layer, formed by thermal oxidation, in its portion located on the bottom face of the trench has a larger thickness than that in its portion located on the side face of the trench. lowering the threshold voltage and increasing the resistance to voltage across a gate and a drain.

Further, the (0001) carbon face, having a high oxidation rate, of a single crystal silicon carbide of hexagonal system constitutes the bottom face of a trench, while the plane, having a low oxidation rate, perpendicular to the (0001) carbon face constitutes the side face of the trench. By virtue of this constitution, a gate oxide layer with the thickness thereof in its portion located on the side face of the trench being different from that in its portion located on the bottom face of the trench can be formed by one-stage thermal oxidation.

According to the third aspect of the present invention, in the first step, a first conductive type high-resistance layer formed of a single crystal silicon carbide of a hexagonal system is laminated on a first conductive type low-resistance layer formed of a single crystal silicon carbide of a hexagonal system to form a semiconductor substrate wherein the surface of the high-resistance layer has a face orientation of the (0001) carbon face. In the second step, a second conductive type semiconductor layer of a single crystal silicon carbide of a hexagonal system having a surface, of which the face orientation is the (0001) carbon face, is formed on the surface of the semiconductor substrate, and a first conductive type semiconductor region is formed in the semiconductor layer in a predetermined region. In the third step, a trench is formed which extends through the semiconductor region and the semiconductor layer into the semiconductor substrate, the trench having a side face perpendicular to the surface of the semiconductor layer and a bottom face parallel to the surface of the semiconductor layer. In the fourth step, the inner wall of the trench is thermally oxidized to form a gate oxide layer as a gate insulating layer, the thickness of the gate oxide layer in the bottom face of the trench being larger than the thickness of the gate oxide layer in the side face of the trench. In the fifth step, a gate electrode layer is formed on the surface of the gate oxide layer, formed by thermal oxidation, within the trench, a first electrode layer is formed on the surface of the semiconductor layer and on the surface of the semiconductor region, and a second electrode layer is formed on the back surface of the semiconductor substrate.

Thus, the semiconductor device according to the second invention is produced.

DESCRIPTION OF THE PREFERRED EMBODIMENTS

EXAMPLE

An embodiment of the present invention will now be described with reference to the accompanying drawings.

Figure 1:
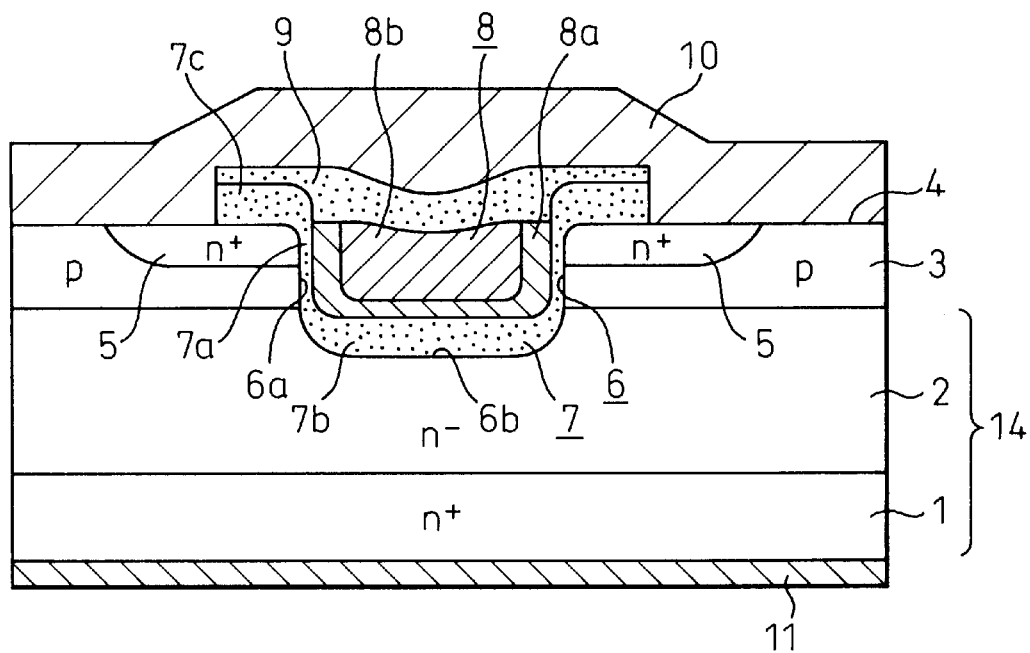
FIG. 1 is a cross-sectional view of an embodiment of the semiconductor device according to the present invention.

FIG. 1 is a cross-sectional view of a trench gate type power MOSFET (vertical power MOSFET) according to an embodiment of the present invention.

An n$^+$ type single crystal SiC substrate 1 as a low-resistance layer is formed of SiC of a hexagonal system having a surface, of which the face orientation is a (0001) carbon face, and has low resistance and a carrier density of about 5×10$^{18}$ cm$^{-3}$. An n type epitaxial layer 2 as a high-resistance layer and a p type epitaxial layer 3 as a semiconductor layer are successively laminated onto the n$^+$ type single crystal SiC substrate 1. The n type epitaxial layer 2 has a carrier density of about 1×10$^{16}$ cm$^{-3}$ and a thickness of about 10 μm. On the other hand, the p tvpe epitaxial layer 3 has a carrier density of about 1×10$^{17}$ cm$^{-3}$ and a thickness of about 2 μm. The p type epitaxial layer 3 has a surface 4 serving as the surface of the device.

In the present embodiment, a semiconductor substrate 14 comprises the n$^+$ type single crystal SiC substrate 1 and the n type epitaxial layer 2.

An n$^+$ source region 5 is formed as a semiconductor region in a predetermined region in the surface 4 of the p type epitaxial layer 3. The n$^+$ source region 5 has a carrier density of about 1×10$^{19}$ cm$^{-3}$ and a junction depth of about 0.5 μm. A trench 6 is provided in a predetermined position of the surface 4 of the p type epitaxial layer 3. The trench 6 extends through the n$^+$ source region 5 and the p type epitaxial layer 3 into the n type epitaxial layer 2 and has a side face 6a perpendicular to the surface of the p type epitaxial layer 3 and a bottom face 6b parallel to the surface of the p type epitaxial layer 3.

A gate electrode layer 8 is disposed, through a gate oxide layer 7, formed by thermal oxidation, as a gate insulating layer, within the trench 6. In this case, the gate oxide layer 7 is formed by one-stage thermal oxidation at 1100° C. for about 5 hr. The gate oxide layer 7 comprises an about 50 nm-thick thin gate oxide layer 7a, formed by thermal oxidation, located on the side face 6a of the trench 6 and an about 500 nm-thick thick gate oxide layer 7b, formed by thermal oxidation, located on the bottom face 6b of the trench 6. Further, the gate oxide layer 7, formed by thermal oxidation, is provided also on the n$^+$ source region 5, and the thickness of the gate oxide layer 7c, formed by thermal oxidation, located on this region is also as large as about 500 nm.

The gate electrode layer 8 is in contact with the gate oxide layer 7, formed by thermal oxidation, and comprises phosphorus-doped first polysilicon layer 8a and second polysilicon layer 8b. A layer-insulation layer 9 having a thickness of about 1 μm is disposed on the gate electrode layer 8. Further, a source electrode layer 10 as a first electrode layer is disposed on the surface of the n$^+$ source region 5 and the surface of the p type epitaxial layer 3, including the surface of the layer-insulation layer 9. The source electrode layer 10 is in contact with both the n$^+$ source region 5 and the p type epitaxial layer 3. A drain electrode layer 11, as a second electrode layer, in contact with the substrate 1 is provided on the back surface of the n$^+$ type single crystal SiC substrate 1.

According to the trench gate type power MOSFET, the gate oxide layer 7a, formed by thermal oxidation, provided on the side face 6a of the trench 6 has a thickness small enough to lower the threshold voltage (for example, to 2 V). Furthermore, the gate oxide layer 7b, formed by thermal oxidation, provided on the bottom face 6b of the trench 6 has a large thickness enough to increase the voltage resistance between the gate and the drain (for example, to not less than 500 V). Furthermore, SiC has a larger forbidden band width than Si and, hence, has higher voltage resistance than Si, enabling the voltage resistance between the gate and the drain to further increase.

A process of producing the trench gate type power MOSFET will now be described in more detail with reference to FIGS. 2 to 6.

Figure 2:
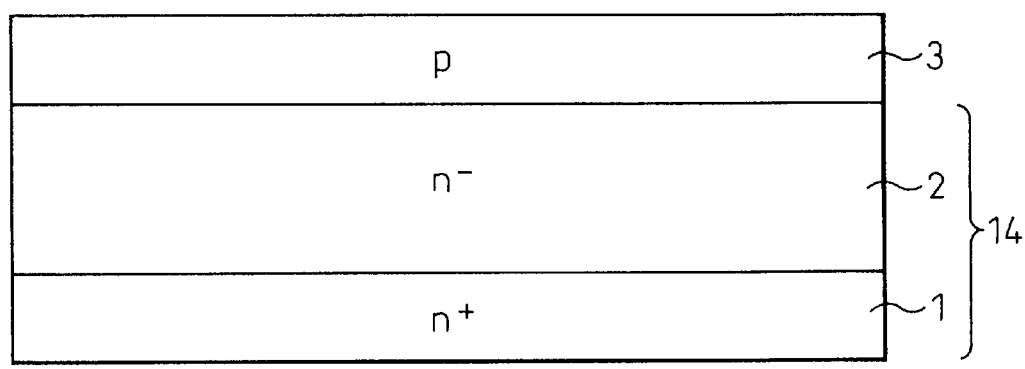
FIG. 2 is a cross-sectional view illustrating a process frproducing an embodiment of the semiconductor device according to the present invention.

At the outset, as shown in FIG. 2, a low-resistance $n^+$ type single crystal SiC substrate 1 having a surface of which the face orientation is the (0001) carbon face, is provided. An about 10 $\mu$m-thick n type epitaxial layer 2 having a carrier density of about $1\times10^{16}$ cm$^{-3}$ and an about 2 $\mu$m-thick p type epitaxial layer 3 having a carrier density of about $1\times10^{17}$ cm$^{-3}$ are successively laminated onto the surface of the $n^+$ type single crystal SiC substrate 1.

Thus, a semiconductor substrate 14 consisting of an $n^+$ type single crystal SiC substrate 1 and an n type epitaxial layer 2 is formed.

Figure 3:
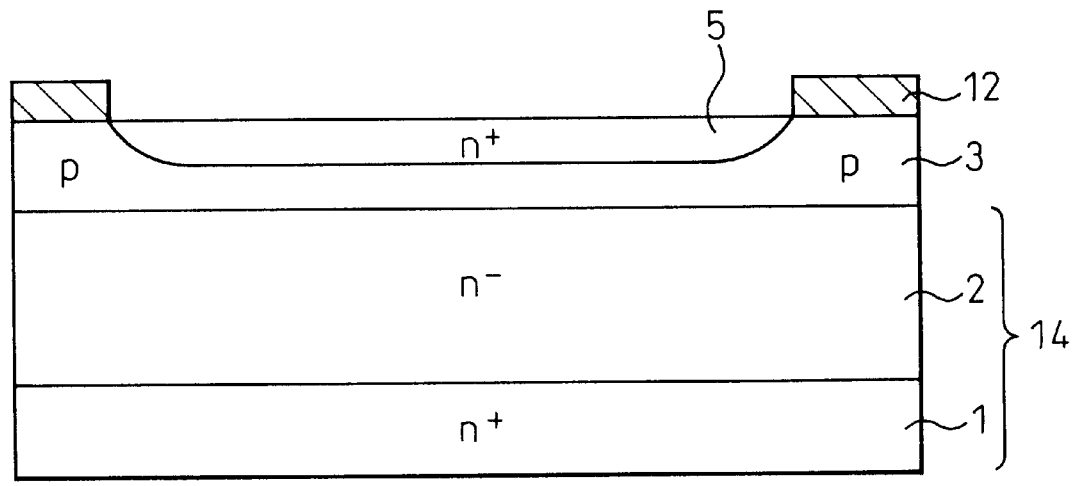
FIG. 3 is a cross-sectional view illustrating a process for producing an embodiment of the semiconductor device according to the present invention.

Subsequently, as shown in FIG. 3, an $n^+$ source region 5 having a surface carrier density of about $1\times10^{19}$ cm$^{-3}$ and a junction depth of about 0.5 $\mu$m is formed by ion implantation using a mask 12 on the p type epitaxial layer 3.

Figure 4:
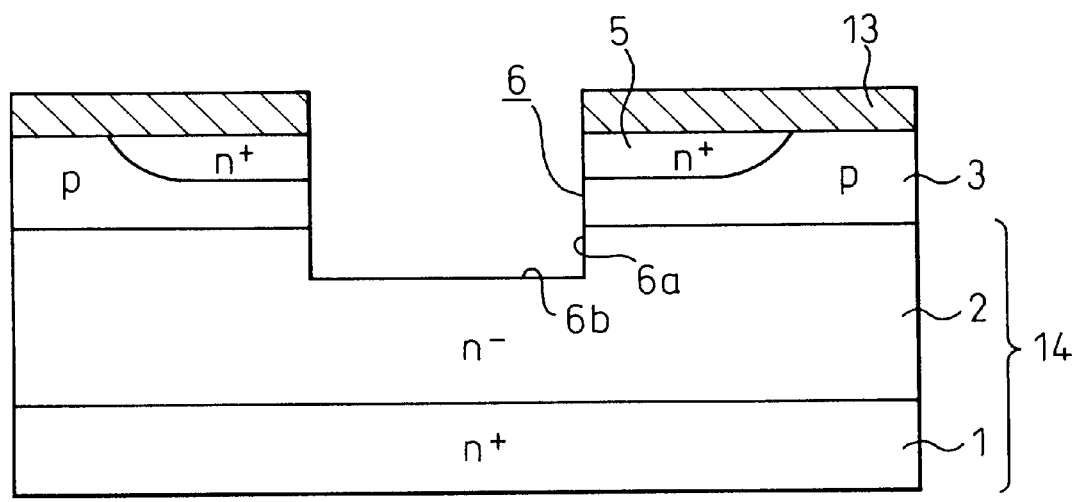
FIG. 4 is a cross-sectional view illustrating a process for producing an embodiment of the semiconductor device according to the present invention.

Thereafter, as shown in FIG. 4, a trench 6 extending through the $n^+$ source region 5 and the p type epitaxial layer 3 into the n type epitaxial layer 2 is formed by reaction ion etching (RIE) using a mask 13. The trench 6 has a side face 6a perpendicular to the surface of the p type epitaxial layer 3 and a bottom face 6b parallel to the surface of the p type epitaxial layer 3.

Figure 5:
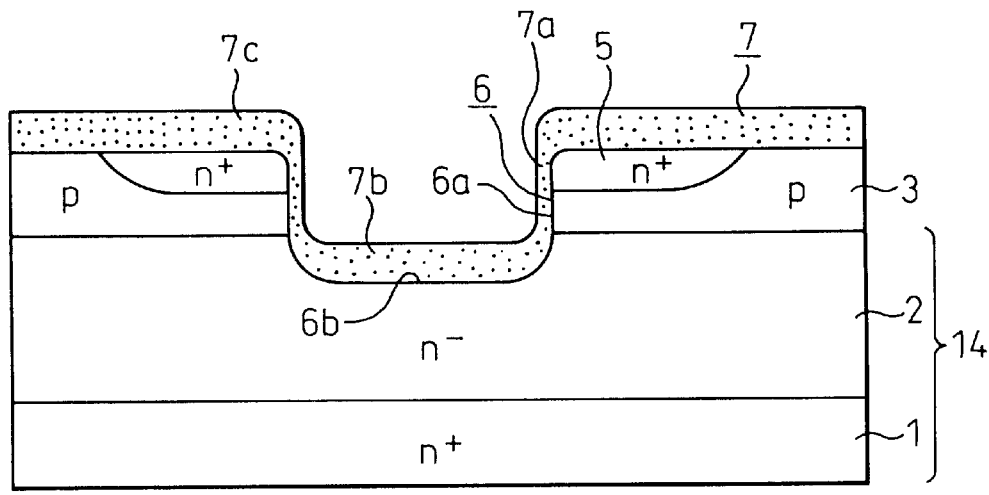
FIG. 5 is a cross-sectional view illustrating a process for producing an embodiment of the semiconductor device according to the present invention.

Subsequently, as shown in FIG. 5, the mask 13 is removed, and a gate oxide layer 7, formed by thermal oxidation, is formed by one-stage thermal oxidation at 1100° C. for about 5 hr. The thermal oxidation results in formation of an about 50 nm-thick thin gate oxide layer 7a on the side face 6a of the trench 6 and an about 500 nm-thick thick gate layer 7b on the bottom face 6b of the trench 6. Further, an about 500 nm-thick thick gate oxide layer 7c is formed on the $n^+$ source region 5.

Figure 6:
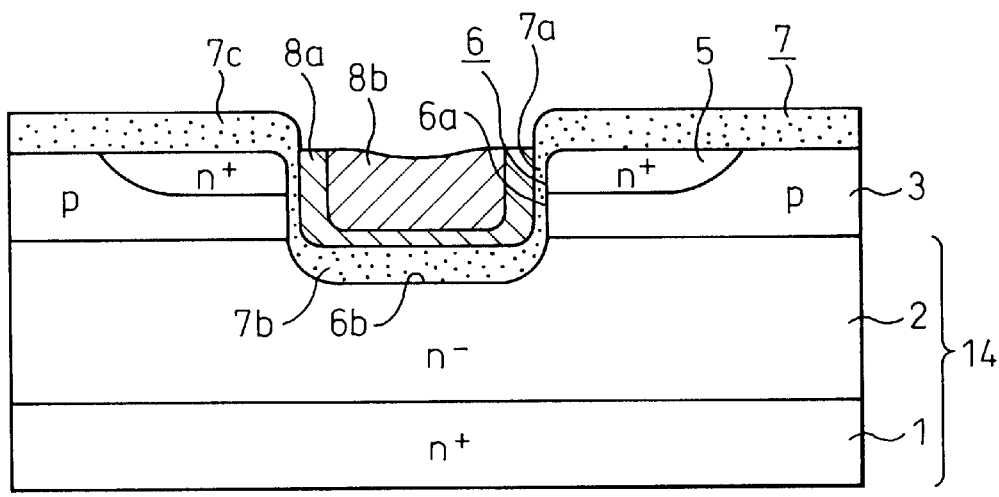
FIG. 6 is a cross-sectional view illustrating a process for producing an embodiment of the semiconductor device according to the present invention.
Figure 7:
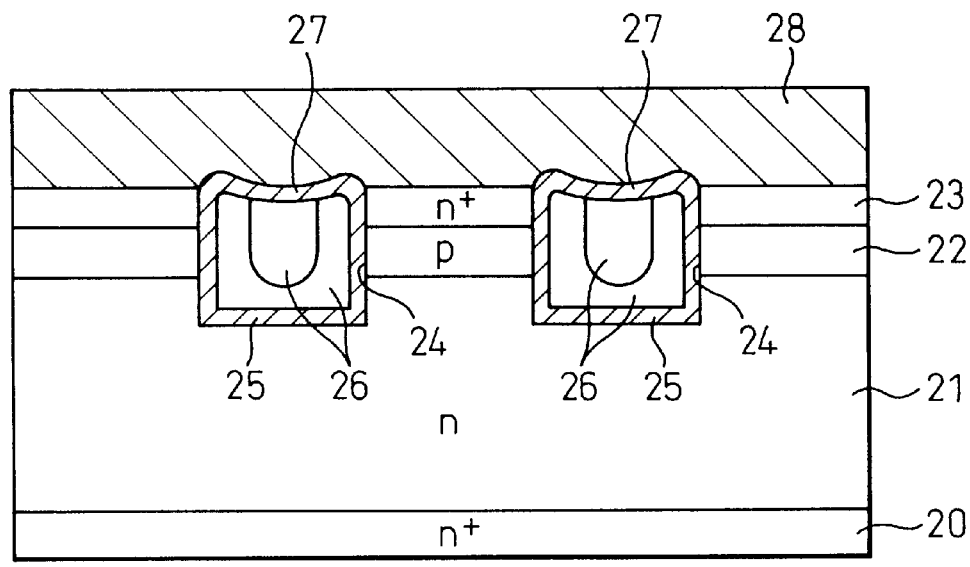
FIG. 7 is a cross-sectional view of a conventional semiconductor device.
Figure 8:
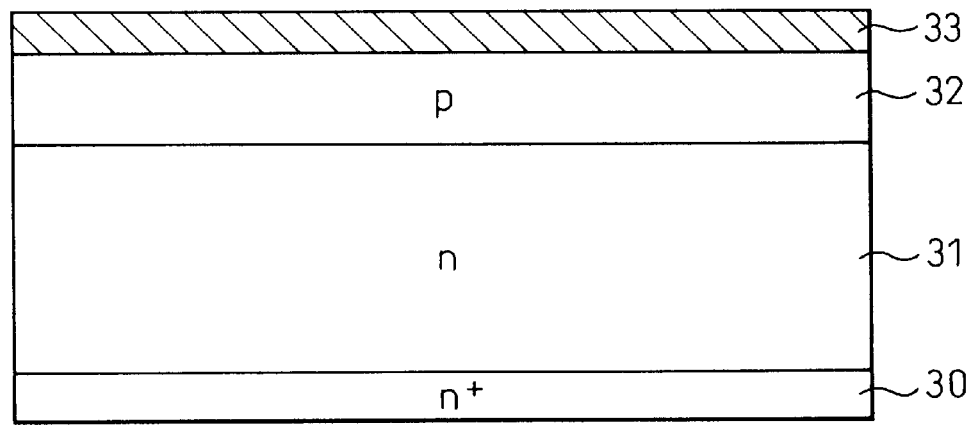
FIG. 8 is a cross-sectional view illustrating a process for producing a conventional semiconductor device.
Figure 9:
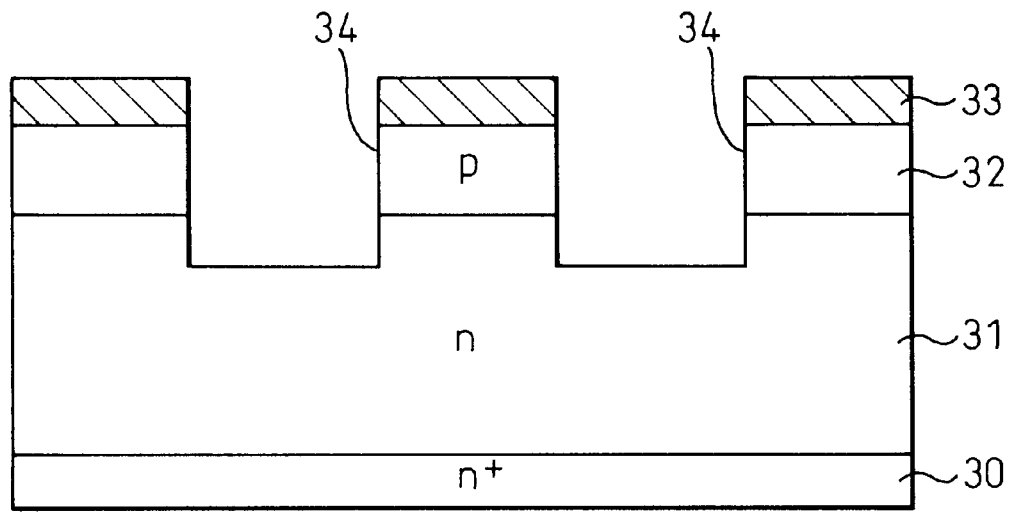
FIG. 9 is a cross-sectional view illustrating a process for producing a conventional semiconductor device.
Figure 10:
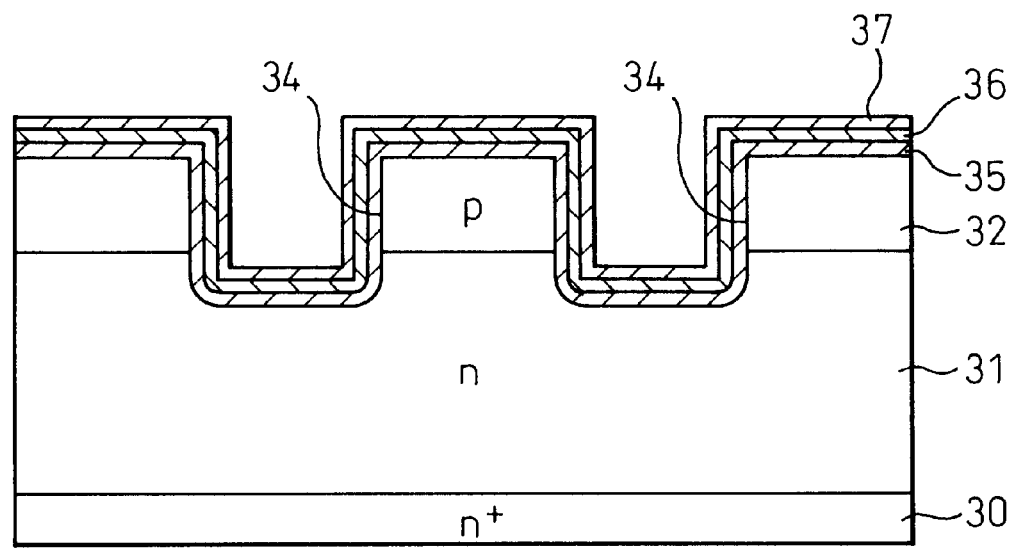
FIG. 10 is a cross-sectional view illustrating a process for producing a conventional semiconductor device.
Figure 11:
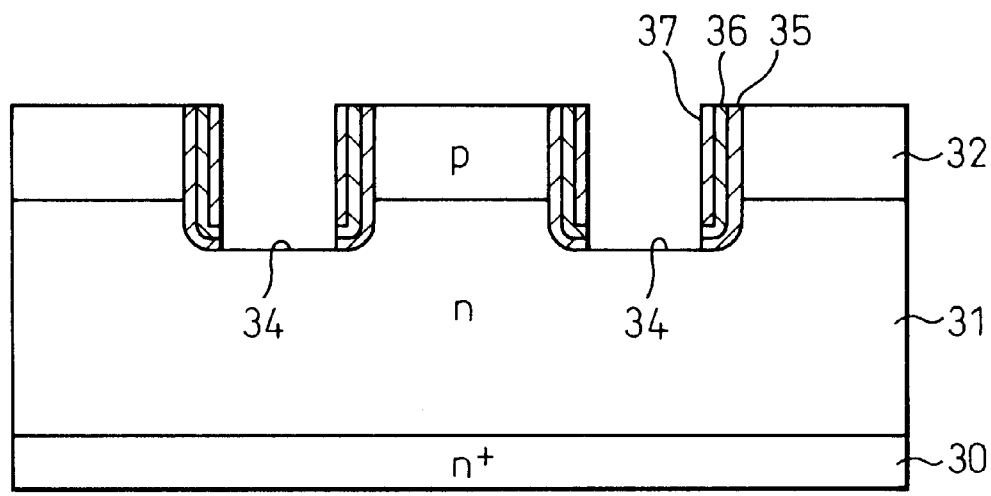
FIG. 11 is a cross-sectional view illustrating a process for producing a conventional semiconductor device.
Figure 12:
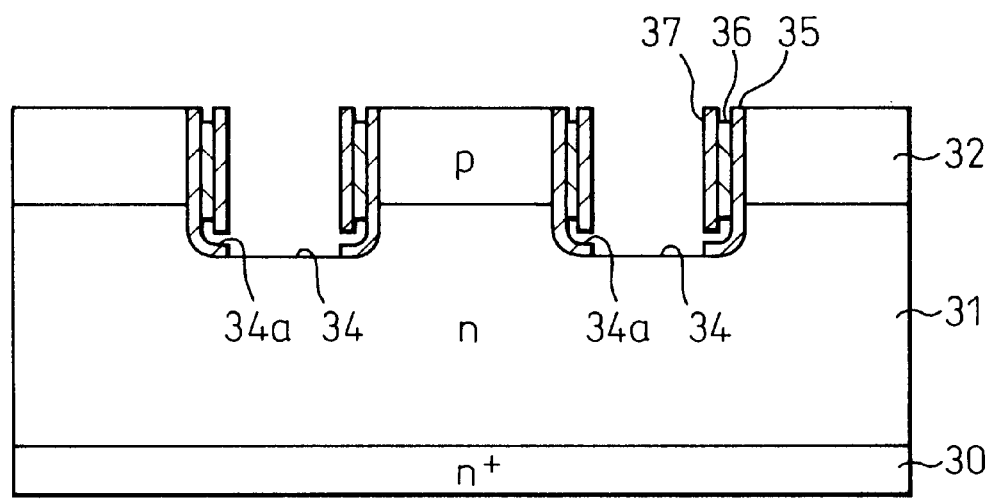
FIG. 12 is a cross-sectional view illustrating a process for producing a conventional semiconductor device.
Figure 13:
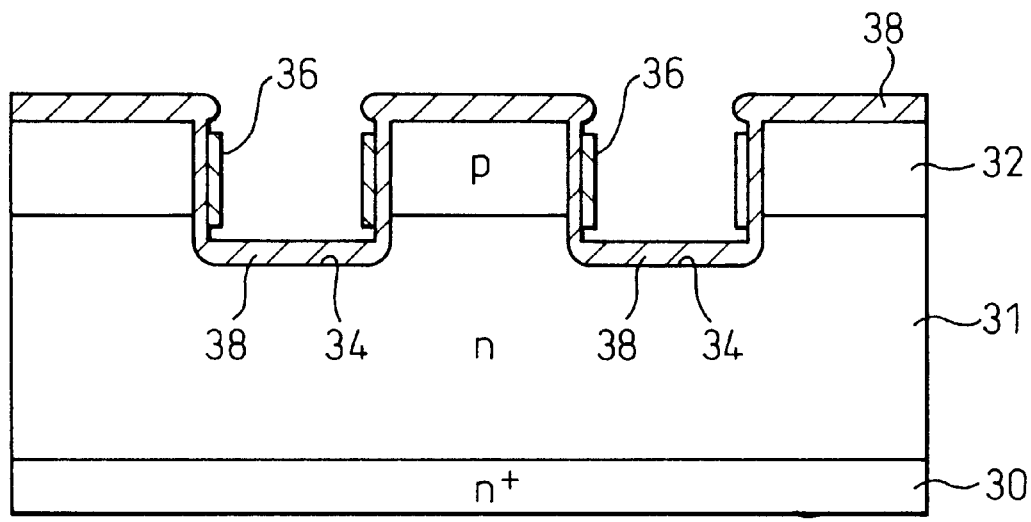
FIG. 13 is a cross-sectional view illustrating a process for producing a conventional semiconductor device.
Figure 14:
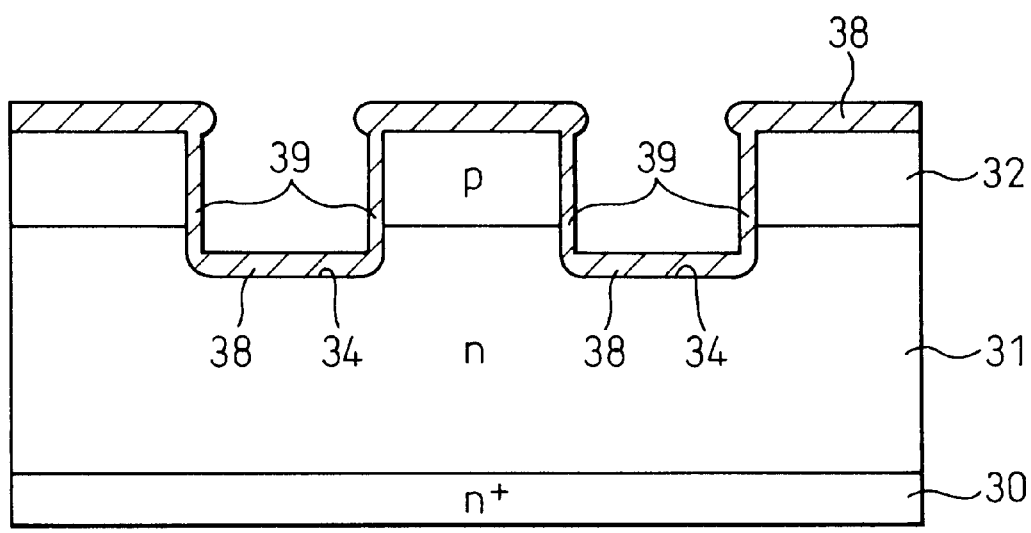
FIG. 14 is a cross-sectional view illustrating a process for producing a conventional semiconductor device.
Figure 15:
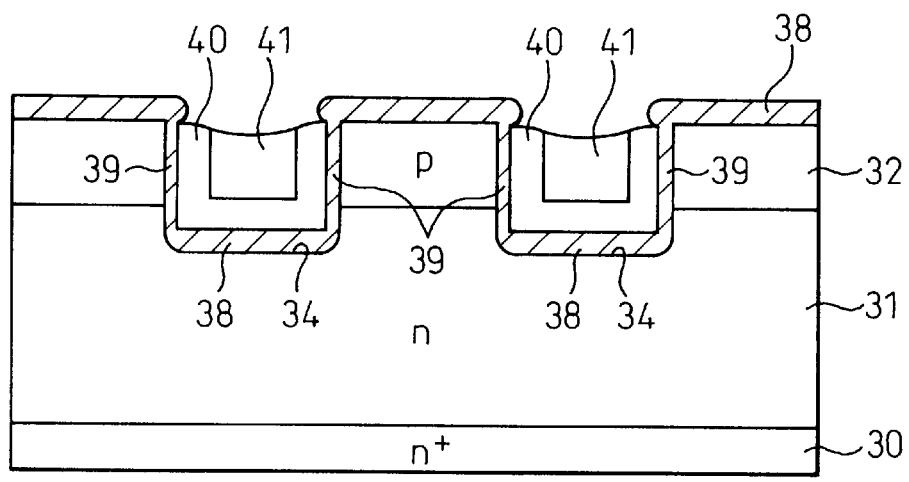
FIG. 15 is a cross-sectional view illustrating a process for producing a conventional semiconductor device.
Figure 16:
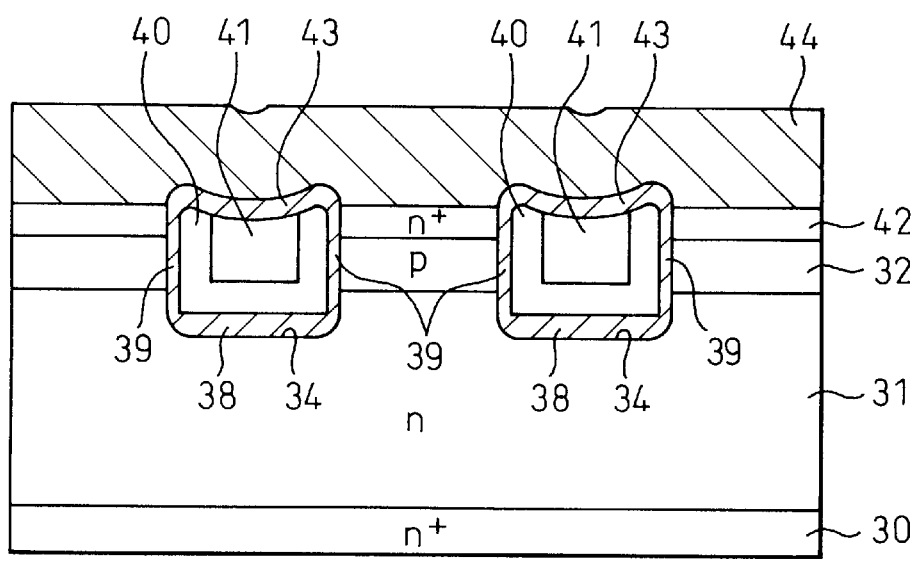
FIG. 16 is a cross-sectional view illustrating a process for producing a conventional semiconductor device.

Then, as shown in FIG. 6, the interior of the trench 6 is filled successively with a first polysilicon layer 8a and a second polysilicon layer 8b.

Thereafter, as shown in FIG. 1, a layer-insulation layer 9 is formed, by CVD, on the gate oxide layer 7 and the surface of the first and second polysilicon layers 8a, 8b. The gate oxide layer 7 and the layer-insulation layer 9 which are located on the surface of the n'source region 5 and the p type epitaxial layer 3, are removed in a predetermined position where a source contact is to be provided. Thereafter, a source electrode layer 10 is formed on the $n^+$ source region 5, the p type epitaxial layer 3, and the layer-insulation layer 9, and, further, a drain electrode layer 11 is formed on the back surface of the $n^+$ type single crystal SiC substrate 1, thereby completing a trench gate type SiC power MOSFET.

Thus, the trench gate type power MOSFET according to the present embodiment comprises: a semiconductor substrate 14 comprising two layers of an $n^+$ type single crystal SiC substrate 1 (a first conductive type low-resistance layer) and an n type epitaxial layer 2 (a first conductive type high-resistance layer) provided on the $n^+$ type single crystal SiC substrate 1, the semiconductor substrate 14 being formed of a single crystal silicon carbide of a hexagonal system so that the surface of the n type epitaxial layer 2 has a face orientation of a (0001) carbon face; a p type epitaxial layer 3 (a second conductive type semiconductor layer), provided on the surface of the semiconductor substrate 14, formed of a single crystal silicon carbide of hexagonal system having a surface of which the face orientation is (0001) carbon face; an $n^+$ source region 5 (a first conductive type semiconductor region) provided in the p type epitaxial layer 3 in a predetermined region; a trench 6 extending through the $n^+$ source region 5 and the p type epitaxial layer 3 into the semiconductor substrate 14 and having a side face 6a perpendicular to the surface of the p type epitaxial layer 3 and a bottom face 6b parallel to the surface of the p type epitaxial layer 3; a gate oxide layer 7 as a gate insulating layer, formed by thermal oxidation, provided on the side face 6a and the bottom face 6b of the trench 6, the thickness of the gate oxide layer in the bottom face 6b of the trench 6 being larger than the thickness of the gate oxide layer in the side face 6b of the trench 6; a gate electrode layer 8 provided on the surface of the gate oxide layer 7 within the trench 6; a source electrode layer 10 (a first electrode layer) provided on the surface of the p type epitaxial layer 3 and the surface of the $n^+$ source region 5; and a drain electrode layer 11 (a second electrode layer) provided on the back surface of the semiconductor substrate 14.

In the above construction, the p type epitaxial layer 3 in its surface located at the side face 6a of the trench 6 serves as a channel, permitting a current to flow between a source and a drain. In this case, the gate oxide layer 7 as a gate insulating layer, formed by thermal oxidation, located on the bottom face 6b of the trench 6 has a larger thickness than that located on the side face 6a of the trench 6, lowering the threshold voltage and increasing the resistance to voltage across a gate and a drain. Specifically, since the gate oxide layer 7a, formed by thermal oxidation, in its portion located on the side face 6a of the trench 6 is thin, the threshold voltage can be decreased (for example, to 2 V). On the other hand, since the gate oxide layer 7b, formed by thermal oxidation, in its portion located on the bottom face 6b of the trench 6 is thick, the resistance to voltage across a gate and a drain can be increased (for example, to not less than 500 V) and, at the same time, the parasitic capacitance can be decreased, realizing a high-speed operation. Furthermore, since the oxide film 7c provided on the surface of the device has a large thickness, the resistance to voltage across a source and a gate is improved. Furthermore, the adoption of the trench structure contributes to a lowering in on resistance. Furthermore, the (0001) carbon face, having a hiah oxidation rate, of a sinale crystal silicon carbide of hexagonal system constitutes the bottom face 6b of the trench 6. while the plane, having a low oxidation rate, perpendicular to the (0001) carbon face constitutes the side face 6a of the trench 6. By virtue of this constitution, an oxide layer 7 with the thickness thereof in its portion located on the side face 6a of the trench 6 being different from that in its portion located on the bottom face 6b of the trench 6 can be formed by one-stage thermal oxidation. That is, the present invention has effectively utilized such a feature of SiC that the difference in oxidation rate between crystal planes is more significant than that in the case of Si. This enables the contemplated layer thickness distribution of the gate oxide layer to be realized by one-stage thermal oxidation. This in turn results in lowered production cost and improved production yield.

The following steps were carried out: the step of laminating an n type epitaxial layer 2 (a first conductive type high-resistance layer) formed of a single crystal silicon carbide of hexagonal system on an n+ type single crystal SiC substrate 1 (a first conductive type low-resistance layer) formed of a single crystal silicon carbide of hexagonal system to form a semiconductor substrate 14 wherein the plane orientation of the n type epitaxial layer 2 in its surface is a (0001) carbon face (first step). the step of forming a on the surface of the semiconductor substrate 14, a p type epitaxial layer 3 (a second conductive type semiconductor layer) of a single crystal silicon carbide of hexagonal system having a surface, of which the face orientation is a (0001) carbon face, and forming an n+ source region 5 (a first conductive type semiconductor region) in the p type epitaxial layer 3 in its predetermined region (second step); the step of forming a trench 6 extending through the n+ source region 5 and the p type epitaxial layer 3 into the semiconductor substrate 14 and having a side face 6a perpendicular to the surface of the p type epitaxial layer 3 and a bottom face 6b parallel to the surface of the p type epitaxial laver 3 (third step). the step of thermally oxidizing the inner wall of the trench 6 to form a gate oxide layer 7 as a gate insulating layer, formed by thermal oxidation, the thickness of the gate oxide laver in the bottom face 6b of the trench 6 being larger than the thickness of the gate oxide layer in the side face 6a of the trench 6 (fourth step); and the step of forming a gate electrode layer 8 on the surface of the gate oxide layer 7, formed by thermal oxidation, within the trench 6, a source electrode layer 10 (a first electrode layer) on the surface of the p type epitaxial layer 3 and on the surface of the n+ source region 5, and a drain electrode layer 11 (a second electrode layer) on the back surface of the semiconductor substrate 14 (fifth step).

Thus, the above trench gate type power MOSFET is produced.

The present invention is not limited to the above embodiments. For example, although the n channel type semiconductor device alone has been described above, it is needless to say that the same effect can be attained also in a p channel type semiconductor device wherein n and p in the semiconductor type have been replaced with each other. Further, it should be noted that the thickness of the oxide layer. formed by thermal oxidation, within the trench is not limited to that in the above embodiment (i.e., thickness thereof in the side face: about 50 nm, the thickness thereof in the bottom face: about 500 nm) and any construction may be adopted so far as the thickness of the oxide layer, formed by thermal oxidation, located on the bottom face of the trench is larger than that located on the side face of the trench.

Preferably, the thickness has a side face to bottom face ratio of 1:2 or lower. The thickness in the side face is preferably in the range from 10 to 100 nm.

As is apparent from the above detailed description, the first aspect of this invention provides a semiconductor device which can be easily produced and has an oxide layer with the thickness thereof being varied from portion to portion of the inner surface of the trench. The second and third aspect of this invention provide a semiconductor device, which can be easily produced and has low threshold voltage and high resistance to voltage, and a process of producing the same.

Figure 17:
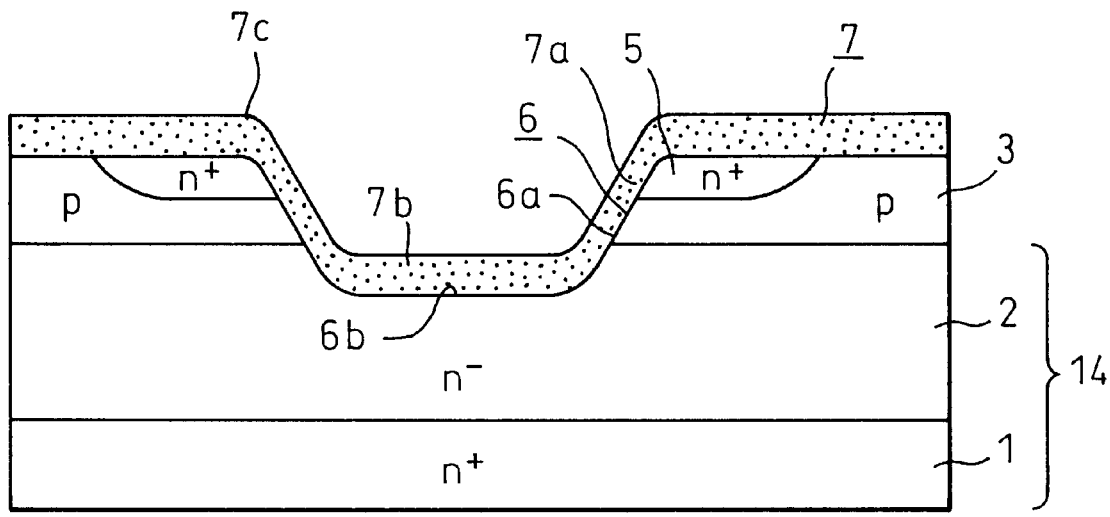
FIG. 17 is a cross-sectional view illustrating a trench having side faces inclined to the (0001) carbon face and a bottom face parallel to the (0001) carbon face according to the present invention.
Figure 18:
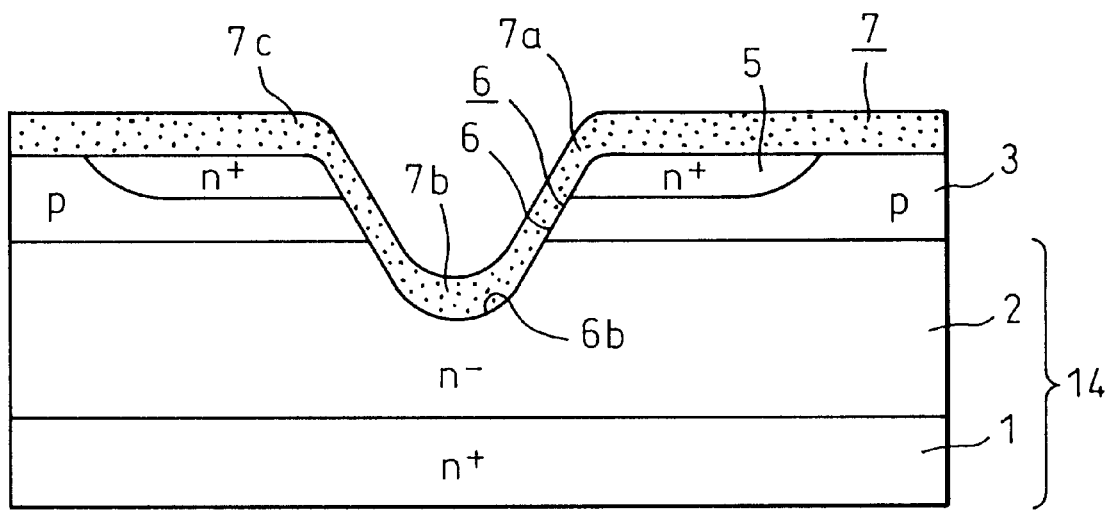
FIG. 18 is a cross-sectional view illustrating a trench having side face inclined to the (0001) carbon face and round bottom face.
Figure 19:
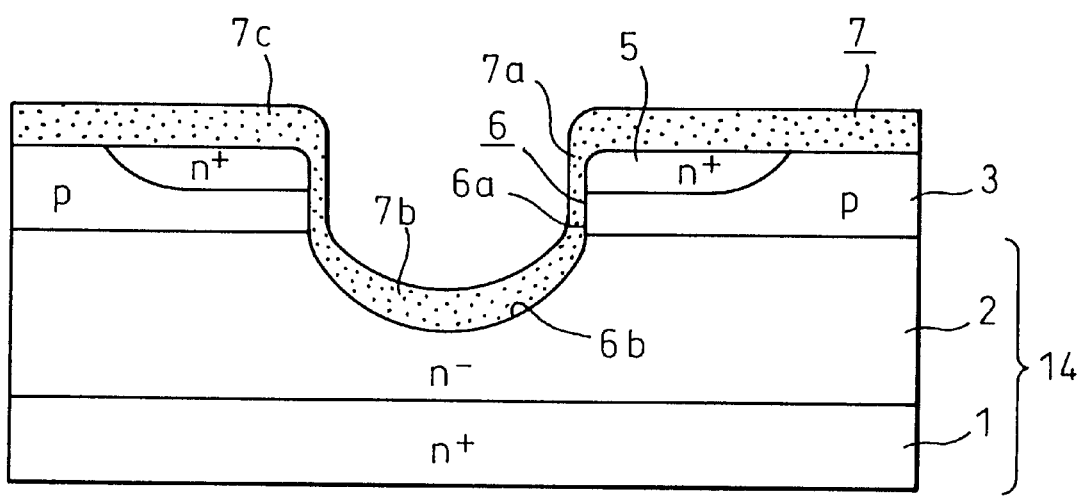
FIG. 19 is a cross-sectional view illustrating a trench having side faces perpendicular to the (0001) carbon face and a round bottom face.
Figure 20:
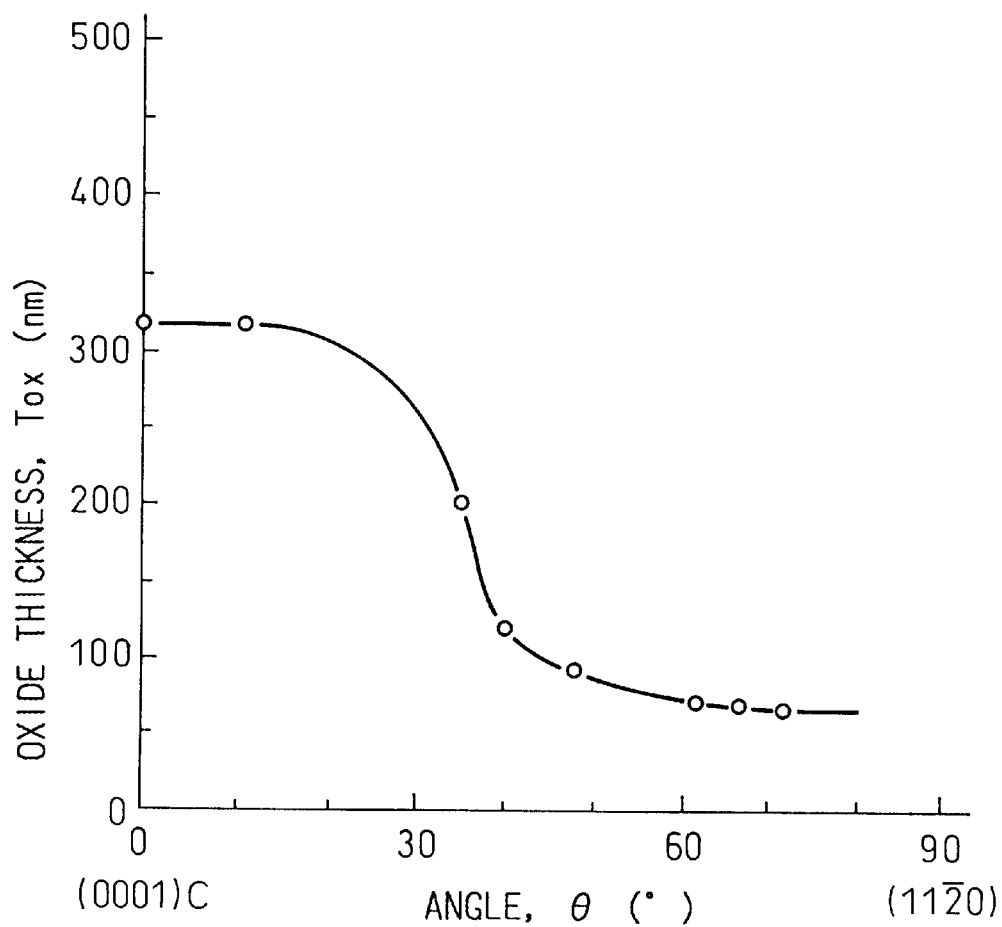
FIG. 20 is a graph showing the thickness of the oxide layers as a function of the angle of inclination of the side face of the trench.
Figure 21:
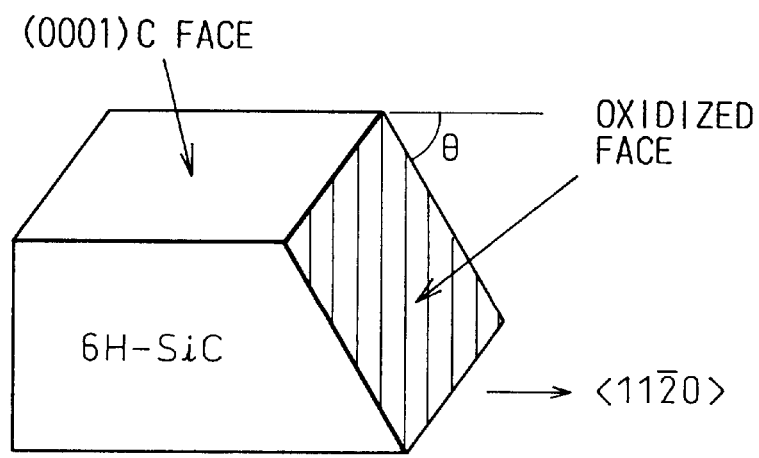
FIG. 21 shows the angle of inclination θ of the side face of the trench.

The side face of the trench is not necessarily perpendicular to the (0001) carbon face but may have an inclination to the latter as shown in FIGS. 17 and 18. The bottom face of the trench is not necessarily parallel to the (0001) carbon face but may be round as shown in FIGS. 18 and 19. FIG. 20 shows the thickness of the oxide layer as a function of the angle of inclination of the side face of the trench with respect to the (0001) carbon face. The angle of inclination θ is defined as shown in FIG. 21. It can be seen from FIG. 20 that the angle of inclination is preferably from 45° to 90°; more preferably from 60° to 90°.

We claim:

1. A process for producing a semiconductor device, comprising:

laminating a first conductive type high-resistance layer formed of a single crystal silicon carbide of a hexagonal system on a first conductive type low-resistance layer formed of a single crystal silicon carbide of a hexagonal system to form a semiconductor substrate;

forming, on the surface of said semiconductor substrate, a second conductive type semiconductor layer of a single crystal silicon carbide of a hexagonal system, and forming a first conductive type semiconductor region in a predetermined region of said semiconductor layer;

forming a trench extending through said semiconductor region and said semiconductor layer into said semiconductor substrate, said trench having a side face and a bottom face, said bottom face having a flat surface of a (0001) carbon face;

performing a single thermal oxidizing step to thermally oxidize the inner wall of said trench to form a gate oxide layer as a gate insulating layer, the thickness of said gate oxide layer on the bottom face of said trench being larger than the thickness of said gate oxide layer on the side face of said trench, the thicker gate oxide layer on the bottom face being formed in the same oxidizing step as the thinner gate oxide layer on the side face; and forming a gate electrode layer on the surface of said gate oxide layer, formed by thermal oxidation, within said trench, forming a first electrode layer on the surface of said semiconductor layer and on the surface of said semiconductor region, and forming a second electrode layer on the back surface of said semiconductor substrates, wherein rounded corners are formed at an intersection of said side face and said bottom face of said trench during said single thermal oxidizing step.

2. A process for producing a semiconductor device according to claim 1, wherein said trench forming step includes the step of forming said side face of said trench to include a surface inclined at an angle of from 45° to 90° to said surface of said single crystal silicon carbide.

3. A process for producing a semiconductor device according to claim 1, wherein said trench forming step includes the step of forming said bottom face of said trench to include a surface parallel to said surface of said single crystal silicon carbide.

4. A process for producing a semiconductor device according to claim 1, wherein said oxidizing step includes the step of forming said gate oxide layer so that said thickness of said gate oxide layer on said bottom face of said trench is at least twice said thickness of said gate oxide layer on said side face of said trench.

5. A process for producing a semiconductor device according to claim 1, wherein said laminating step includes the step of forming a surface of said first conductive type high-resistance layer to have a (0001) carbon face.

6. A process for producing a semiconductor device according to claim 1, wherein said second conductive type semiconductor layer forming step includes the step of forming a surface of said second conductive type semiconductor layer to have a (0001) carbon face.

7. A process for producing a semiconductor device according to claim 1, wherein said step of forming a trench through said semiconductor region and said semiconductor layer into said semiconductor substrate forms said trench by etching, and said single thermal oxidizing step forms said oxide layer on said inner wall of said trench and said bottom face of said trench to follow a shape of said trench.

8. A process for producing a semiconductor device according to claim 1, wherein said single thermal oxidation step provides a thick oxide layer means on said bottom face for an improved breakdown voltage, and a thin oxide layer means on said side face for suppressing an increase in a threshold voltage.

9. A process for producing a vertical MOSFET using silicon carbide, comprising the steps of:

forming a trench in a silicon carbide substrate having rounded corners and a flat bottom face with a (0001) carbon face; and forming a gate oxide layer in the trench so as to form a thinner oxide layer on a trench side face in which a channel region is formed upon operation of the vertical MOSFET and a thicker oxide layer having a greater thickness than the thinner oxide layer on a trench bottom face, wherein the thinner oxide layer and the thicker oxide layer are formed in a single step.

10. A process for producing a semiconductor device, comprising:

laminating a first conductive type high-resistance layer formed of a single crystal silicon carbide of a hexagonal system on a first conductive type low-resistance layer formed of a single crystal silicon carbide of a hexagonal system to form a semiconductor substrate;

forming, on the surface of said semiconductor substrate, a second conductive type semiconductor layer of a single crystal silicon carbide of a hexagonal system, and forming a first conductive type semiconductor region in a predetermined region of said semiconductor layer;

forming a trench extending through said semiconductor region and said semiconductor layer into said semiconductor substrate, said trench having a side face and a bottom face, said bottom face having a surface with a first inclination of 30° or less to a (0001) carbon face and said side face of said trench having a second inclination greater than 45° and less than 90° with respect to said (0001) carbon face;

thermally oxidizing an inner wall of said trench to form a gate oxide layer as a gate insulating layer in a single step, wherein a first oxidation speed of said side face is smaller than a second oxidation speed of said bottom face, the thickness of said gate oxide layer on the bottom face of said trench being larger than the thickness of said gate oxide layer on the side face of said trench, the difference between the thickness of said gate oxide layer on said bottom face of said trench to the thickness of said gate oxide layer on said side face of said trench varying with said second inclination, and the thicker gate oxide layer on the bottom face being formed in the same oxidizing step as the thinner gate oxide layer on the side face; and forming a gate electrode layer on the surface of said gate oxide layer, formed by thermal oxidation, within said trench, forming a first electrode layer on the surface of said semiconductor layer and on the surface of said semiconductor region, and forming a second electrode layer on the back surface of said semiconductor substrate.

11. A process for producing a semiconductor device according to claim 10, wherein said first oxidation speed is about one-third of said second oxidation speed.

12. A process for producing a semiconductor device according to claim 10, wherein said single thermal oxidation step provides a thick oxide layer means on said bottom face for an improved breakdown voltage, and a thin oxide layer means on said side face for suppressing an increase in a threshold voltage.

13. A process for producing a semiconductor device according to claim 10, wherein forming said trench forms a trench having rounded corners and said bottom face has a flat region.

* * * * *